(12) United States Patent
Boonman et al.

(10) Patent No.: US 6,741,331 B2
(45) Date of Patent: May 25, 2004

(54) LITHOGRAPHIC APPARATUS WITH IMPROVED EXPOSURE AREA FOCUS, DEVICE MANUFACTURING METHOD, AND DEVICE MANUFACTURED THEREBY

(75) Inventors: Marcus Emile Joannes Boonman, Veldhoven (NL); Johannes Catharinus Hubertus Mulkens, Maastricht (NL); Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/066,784

(22) Filed: Feb. 6, 2002

(65) Prior Publication Data

US 2002/0167651 A1 Nov. 14, 2002

(30) Foreign Application Priority Data

Feb. 8, 2001 (EP) .............................. 01301116

(51) Int. Cl.⁷ ..................... G03B 27/54; G03B 27/42; G03B 27/32; G03B 27/52
(52) U.S. Cl. .............................. 355/67; 355/53; 355/77; 355/55
(58) Field of Search ................. 355/53, 55, 47, 355/77, 57, 60; 356/500; 430/5; 359/399, 400, 401

(56) References Cited

U.S. PATENT DOCUMENTS

| | | | |
|---|---|---|---|
| 5,202,748 A | | 4/1993 | MacDonald et al. |
| 5,801,832 A | * | 9/1998 | Van Den Brink ........... 356/500 |
| 6,118,515 A | * | 9/2000 | Wakamoto et al. ........... 355/53 |
| 6,304,316 B1 | * | 10/2001 | Jain et al. ..................... 355/53 |

FOREIGN PATENT DOCUMENTS

| | | |
|---|---|---|
| EP | 0 480 616 A2 | 4/1992 |
| JP | 61196532 | 8/1986 |

* cited by examiner

Primary Examiner—Peter B. Kim
(74) Attorney, Agent, or Firm—Pillsbury Winthrop LLP (57) ABSTRACT

In a lithographic apparatus the shape of the focal plane is adjusted using available manipulators in the projection lens system so that it is in closer conformity to the shape of the wafer surface in the exposure area. The control of the focal plane shape can be integrated with the leveling control which determines the height and tilt of the wafer surface.

20 Claims, 4 Drawing Sheets

LITHOGRAPHIC APPARATUS WITH IMPROVED EXPOSURE AREA FOCUS, DEVICE MANUFACTURING METHOD, AND DEVICE MANUFACTURED THEREBY

BACKGROUND OF THE INVENTION

1. Field of the Invention

This application claims priority to EPC application No. 01301116.8 filed Feb. 8, 2001, herein incorporated by reference.

2. Background of the Related Art

The present invention relates generally to lithographic projection apparatus and more particularly to lithographic projection apparatus including a controller to adjust a shape of a focal plane of the projection system.

In general, a lithographic projection apparatus in accordance with embodiments of the present invention includes a radiation system for supplying a projection beam of radiation; a support structure for supporting patterning structure, the patterning structure serving to pattern the projection beam according to a desired pattern; a substrate table for holding a substrate; and a projection system for projecting the patterned beam onto a target portion of the substrate, said projection system having a focal plane and comprising at least one adjustable element capable of changing the shape of the focal plane.

The term "patterning structure" as here employed should be broadly interpreted as referring to structure that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask according to the pattern on the mask. In the case of a mask the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193, and PCF patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (eg comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously-scanning the substrate table parallel or antiparallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this terns should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and U.S. Pat. No. 6,262,796 incorporated herein by reference.

To correctly image the mask pattern onto the substrate it is necessary to position the wafer accurately in the focal plane of the projection lens. The position of the focal plane can vary according to the position of the mask, illumination and imaging settings in the illumination and projection systems and due to, for example, temperature and/or pressure variations in the apparatus, during an exposure or series of exposures. To deal with these variations in focal plane position, it is known to measure the vertical position of the focal plane using a sensor such as a transmission image sensor (TIS) or a reflection image sensor (RIS) and then position the wafer surface in the focal plane. This can be done using so-called "on-the-fly" leveling whereby a level sensor measures the vertical position of the wafer surface during the exposure and adjusts the height and/or tilt of the wafer table to optimize the imaging performance. Alternatively, so-called "off-axis" leveling can be used. In this method, a height map of (a part of) the wafer surface is taken, e.g. in a multi-stage apparatus, in advance of the exposure and height and tilt set points for the exposure, or series of exposures, to optimize the focus according to defined criteria, are calculated in advance. Methods and a system for such off-axis leveling are described in European Patent Application EP-A-1 037 117. In the off-axis method, it is proposed that the exact shape and position of the wafer surface be measured and the wafer height and tilt positions for the exposure can then be optimized to minimize defocus predicted relative to that measured wafer surface. Since the focal plane of the projection system will generally be flat and the wafer surface will generally not be flat, there will always be some residual defocus which cannot be compensated for by leveling procedures.

SUMMARY OF THE INVENTION

One aspect of embodiments of the present invention includes a system and a method for controlling a lithographic projection apparatus to further improve focus across the entire exposure area.

This and other aspects are achieved according to embodiments of the invention in a lithographic apparatus as specified in the opening paragraph, characterized by:

a controller, operative during an exposure for imaging the irradiated portion, to control said adjustable element to change the shape of said focal plane to more closely conform to the surface contour of said exposure area.

As discussed above, certain methods in which the focal plane is generally arranged to be as flat as possible and the substrate height and/or tilt are controlled to minimize defocus, inevitably leave some residual defocus as the wafer surface is generally not exactly flat. According to the present invention, rather than attempting to make the focal plane exactly flat, its shape is deliberately changed to make it conform more closely to the measured surface contour of the substrate in the exposure area to be exposed. Control of the wafer height and tilt is integrated with control of the shape of the focal plane. Then, low order (height and tilt) corrections can be effected by positioning the substrate and high order corrections can be effected by adjustments to the shape of the focal plane. Also, low order effects of high order adjustments to the shape of the focal plane can be compensated for in positioning of the substrate.

Embodiments of the present invention can therefore provide improved imaging by reducing defocus across the entire exposure area. This improves imaging quality on all exposure areas and also makes possible focusing on exposure areas having curved surfaces that would previously have exceeded defocus units.

Embodiments of the present invention can make use of all available manipulators in the projection system to adjust elements that affect the shape of the focal plane. Such manipulators are provided with suitable actuators, e.g. motors, piezoelectric actuators, solenoids, etc., to enable the a controller to adjust the elements to which the manipulators are connected. The adjustable elements may include elements specifically provided for the present invention or provided for other purposes such as correcting field curvature introduced by changes in magnification, or correcting astigmatisms in the lenses. The adjustable elements may have their position and/or orientation in any of the six degrees of freedom changed by the manipulators. Additionally, it is possible to adjust the shape of the element, e.g. where the element is a reflector provided with piezoelectric elements for adjusting its surface figure.

According to a further aspect of embodiments of the invention there is provided a device manufacturing method comprising the steps of:

providing a substrate that is at least partially covered by a layer of radiation-sensitive material;

providing a projection beam of radiation using a radiation system;

using patterning structure to endow the projection beam with a pattern in its cross-section; and projecting the patterned beam of radiation onto a target portion of the layer of radiation-sensitive material using a projection system, said projection system having a focal plane and comprising at least one adjustable element capable of changing the shape of the focal plane;

characterized by the step of:

controlling said adjustable element during the step of imaging to change the shape of said focal plane to more closely conform to the surface contour of said exposure area.

Although specific reference maybe made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (eg. with a wavelength of 365, 248, 193, 157 or 126 nm) and EUV (extreme ultra-violet radiation, eg. having a wavelength in the range 5–20 nm), as well as particle beams, such as ion beams or electron beams.

BRIEF DESCRIPTION OF THE DRAWINGS

The invention and its attendant advantages will be further described below with reference to exemplary embodiments and the accompanying schematic drawings, in which.

In the drawings, like references indicate like parts.

DETAILED DESCRIPTION

Figure 1:
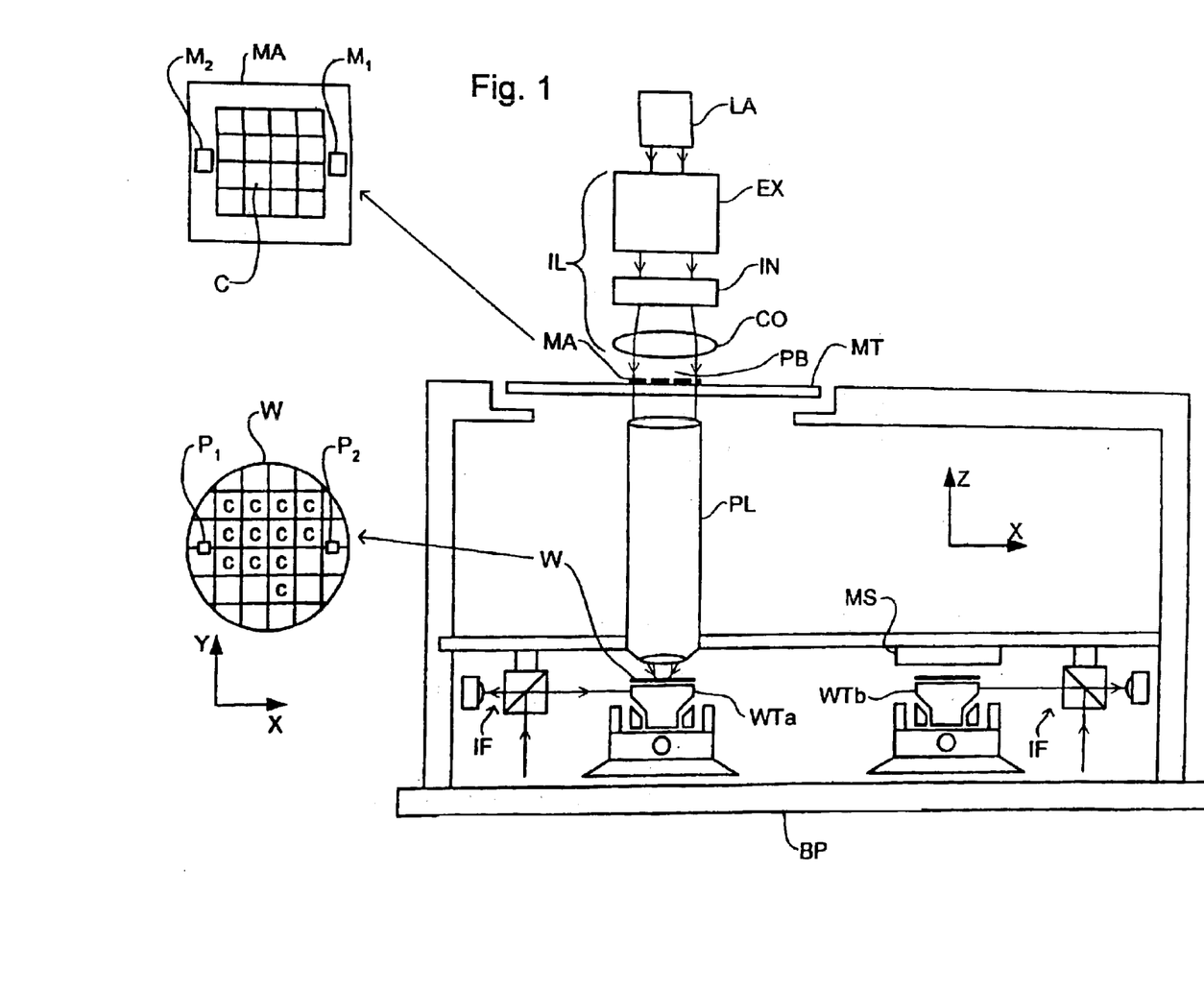
FIG. 1 depicts a lithographic projection apparatus according to a first embodiment of the invention.

FIG. 1 schematically depicts a lithographic projection apparatus according to a particular embodiment of the invention. The apparatus comprises:

- a radiation system LA, IL (EX, IN, CO), for supplying a projection beam PB of radiation (eg. UV or EUV radiation). In this particular case, the radiation system also comprises a radiation source LA;
- a first object table (mask table) MT provided with a mask holder for holding a mask MA (eg. a reticle), and connected to first positioning means for accurately positioning the mask with respect to item PL;
- a second object table (substrate table) WTa provided with a substrate holder for holding a substrate W (eg. a resist-coated silicon wafer), and connected to second positioning means for accurately positioning the substrate with respect to item PL;
- a third object table (substrate or wafer table) WTb provided with a substrate holder for holding a substrate W (eg. a resist-coated silicon wafer), and connected to third positioning means for accurately positioning the substrate with respect to item PL;
- a measurement system MS for performing measurement characterization) processes on a substrate held on a substrate table WTa or WTh at a measurement station
- a projection system ("lens") PL (eg. a refractive or catadioptric system, a mirror group or an array of field deflectors) for imaging an irradiated portion of the mask MA onto a target portion C (eg. comprising one or more dies) of the substrate W held on a substrate table WTa or Wmb at an exposure station.

As here depicted, the apparatus is of a transmissive type (ie has a transmissive mask). However, in general, it may also be of a reflective type, for example (with a reflective mask). Alternatively, the apparatus may employ another kind of patterning structure, such as a programmable mirror array of a type as referred to above.

The source LA (eg. a Hg lamp, an excimer laser, a laser-produced plasma source, a discharge plasma source, an undulator provided around the path of an electron beam in a storage ring or synchrotron, or an electron or ion beam source) produces a beam of radiation. This beam is fed into an illumination system (illuminator) IL, either directly or after having traversed conditioning means, such as a beam expander EX, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA maybe within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the interferometric measuring means IF, the substrate tables WTa, WTb can be moved accurately by the second and third positioning means, eg. so as to position different target portions C in the path of the beam PB. Similarly, the first positioning means can be used to accurately-position the maskMA with respect to the path of the beam PB, eg. after mechanical retrieval of the mask MA from a mask library, or during a scan. In general, movement of the object tables MT, WTa, WTh will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The second and third positioning means may be constructed so as to be able to position their respective substrate tables WTa, WTb over a range encompassing both the exposure station under projection system PL and the measurement station under the measurement system AB. Alternatively, the second ;and third positioning means maybe replaced by separate exposure station and measurement station positioning systems for positioning a substrate table in the respective exposure stations and a table exchange means for exchanging the substrate tables between the two positioning systems. Suitable positioning systems are described, inter alia, in U.S. Pat. No. 6,262,796 mentioned above. It should be noted that a lithography apparatus may have multiple exposure stations and/or multiple measurement stations and that the numbers of measurement and exposure stations may be different than each other and the total number of stations need not equal the number of substrate tables. Indeed, the principle of separate exposure and measurement stations may be employed even with a single substrate table.

The depicted apparatus can be used in two different modes:

1. In step mode, the mask table MT is kept essentially stationary, and an entire mask image is projected at once (ie. a single "flash") onto a target portion C. The substrate table WTa or WTh is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", eg. the y direction) with a speed v, so that the projection beam PB is caused to scan over a mask image; concurrently, the substrate table Wra or Wfb is simultaneously moved in the same or opposite direction at a speed V=Mv, in which M is the magnification of the lens PL (typically, M=¼ or ⅕). In this manner, a relatively large target portion C can be exposed, without having to compromise on resolution.

An important factor influencing the imaging quality of a lithographic apparatus is the accuracy with which the mask image is focused on the substrate. Wafers are generally polished to a very high degree of flatness but nevertheless deviations of the wafer surface from perfect flatness (referred to as "unflatness") of sufficient magnitude noticeably to affect focus accuracy can occur. Unflatness may be caused, for example, by variations in wafer thickness, distortion of the shape of the wafer or contaminants on the substrate table. The presence of structures due to previous process steps also significantly affects the wafer height (flatness). In the present invention, the cause of unflatness is largely irrelevant; only the height of the top surface of the wafer is considered. Unless the context otherwise requires, references below to "the wafer surface" refer to the top surface of the wafer onto which will be projected the mask image.

Figure 2:
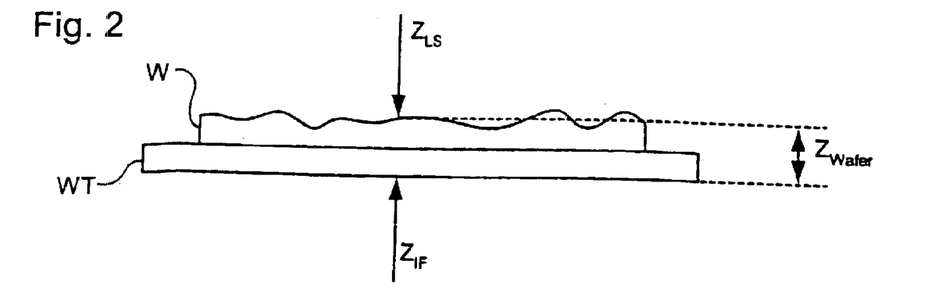
FIG. 2 is a view showing how the wafer height is determined from measurements by the level sensor and the Z-interferometer.

After loading a wafer onto one of the substrate tables WTa, WTh, the height of the wafer surface ZWafer relative to a physical reference surface of the substrate table is mapped. This process is carried out at the measurement station using a first sensor, referred to as the level sensor, which measures the vertical (Z) position of the physical reference surface and the vertical position of the wafer surface, ZLS, at a plurality of points, and a second sensor, for example a Z-interferometer, which simultaneously measures the vertical position of the substrate table, ZIF at the same points. As shown in FIG. 2, the wafer surface height is determined as ZWafer=ZLS−ZIF. The substrate table carrying the wafer is then transferred to the exposure station and the vertical position of the physical reference surface is again determined. The height map is then referred to in positioning the wafer at the correct vertical position during the exposure process. This procedure is described in more detail below with reference to FIGS. 3 to 6.

Figure 3:
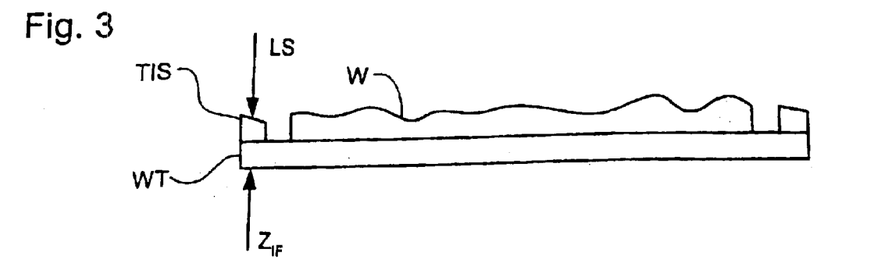
FIGS. 3 to 6 are views showing various steps of the focus control and leveling procedure according to the present invention.

As shown in FIG. 3, first the substrate table is moved so that a physical reference surface fixed to the substrate table is underneath the level sensor LS. The physical reference surface may be any convenient surface whose position in X, Y and Z on the substrate table will not change during processing of a wafer in the lithographic apparatus and, most importantly, in the transfer of the substrate table between measurement and exposure stations. The physical reference surface may be part of a fiducial containing other alignment markers and the surface should have such properties as to allow its vertical position to be measured by the same sensor as measures the vertical position of the wafer surface. The physical reference surface may be a reflective surface in a fiducial in which is inset a so-called transmission image sensor BIDS). The TIS is described further below.

The level sensor may be, for example, an optical sensor, alternatively, pneumatic or capacitive sensors (for example) are conceivable. A presently preferred form of sensor making use of Moirépatterns formed between the image of a projection grating reflected by the wafer surface and a fixed detection grating is described in European Patent Application EP-A-1 037 117. The level sensor should preferably measure the vertical position of a plurality of positions on the wafer surface simultaneously and for each position the sensor may measure the average height of a particular area, so averaging out unflatnesses of high spatial frequencies.

Simultaneously with the measurement of the vertical position of a physical reference surface by the level sensor LS, the vertical position of the substrate table is measured using the Zinterferometer, ZIF. The Z-interferometer may, for example, be part of a three, five or six-axis interferometric metrology system such as that described in U.S. Pat. Nos. 6,020,964, and 6,208,407, which documents are incorporated herein by reference. The Z-interferometer system preferably measures the vertical position of the substrate table at a point having the same position in the XY plane as the calibrated measurement position of the level sensor LS. This may be done by measuring the vertical position of two opposite sides of the substrate table WT (WTa or W WTb at points in line with the measurement position of the level sensor and interpolating/modeling between them. This ensures that, in the event that the substrate table is taped out of the XY plane, the Z-interferometer measurement correctly indicates the vertical position of the substrate table under the level sensor.

Preferably, this process is repeated with at least a second physical reference surface spaced apart, e.g. diagonally, from the first physical reference surface. Height measurements from two or more positions can then be used to define a reference plane.

The simultaneous measurement of the vertical position of one or more physical reference surfaces and the vertical position of the substrate table establishes a point or points determining the reference plane relative to which the wafer height is to be mapped. A Z-interferometer of the type mentioned above is effectively a displacement sensor rather than an absolute sensor, and so requires zeroing, but provides a highly linear position measurement over a wide range. On the other hand, suitable level sensors, e.g. those mentioned above, may provide an absolute position measurement with respect to an externally defined reference plane (i.e. nominal zero) but over a smaller range. Where such sensors are used, it is convenient to move the substrate table vertically under the level sensor until the physical reference surface(s) is (are) positioned at a nominal zero in the middle of the measurement range of the level sensor and to read out the current interferometer Z value. One or more of these measurements on physical reference surfaces will establish the reference plane for the height mapping. The Z-interferometer is then zeroed with reference to the reference plane. In this way the reference plane is related to the physical surface on the substrate table and the ZWafer height map is made independent of the initial zero position of the Z-interferometer at the measurement station and other local factors such as any unflatness in the base plate over which the substrate table is moved. Additionally, the height map is made independent of any drift in the zero position of the level sensor.

Figure 4:
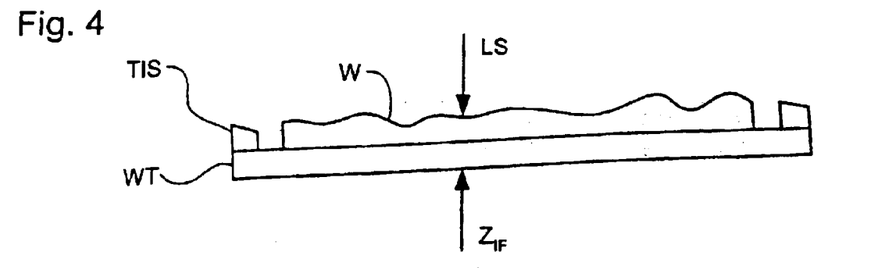

As illustrated in FIG. 4, once the reference plane has been established, the substrate table is moved so that the wafer surface is scanned underneath the level sensor to make the height map. The vertical position of the wafer surface and the vertical position of the substrate table are measured at a plurality of points of known XY position and subtracted from each other to give the wafer height at: the known XY positions. These wafer height values form the wafer height-.map which can be recorded in any suitable form. For example, the wafer height values and XY coordinates may be stored together in so-called indivisible pairs. Alternatively, the points at which wafer height values are taken may be predetermined, e.g. by scanning the wafer along a predetermined path at a predetermined speed and making measurements at predetermined intervals, so that a sample list or array of height values (optionally together with a small number of parameters defining the measurement pattern and/or a starting point) may suffice to define the height map.

The motion of the substrate table during the height mapping scan is largely only in the XY plane. However, if the level sensor LS is of a type which only gives a reliable zero reading, the substrate table is also moved vertically to keep the wafer surface at the zero position of the level sensor. The wafer height is then essentially derived from the Z movements of the substrate table, as measured by the Z-interferometer, necessary to maintain a zero readout from the level sensor. However, it is preferable to use a level sensor that has an appreciable measurement range over which its output is linearly related to wafer height, or can be linearized. Such measurement range ideally encompasses the maximum expected, or permissible, variation in wafer height. With such a sensor, the need for vertical movement of the substrate table during the scan is reduced or eliminated and the scan can be completed faster, since the scan speed is then limited by the sensor response time rather than by the ability of the short stroke positioning of the substrate table to track the contour of the wafer in three dimensions. Also, a sensor with an appreciable linear range can allow the heights at a plurality of positions (e.g. an array of spots) to be measured simultaneously.

Figure 5:
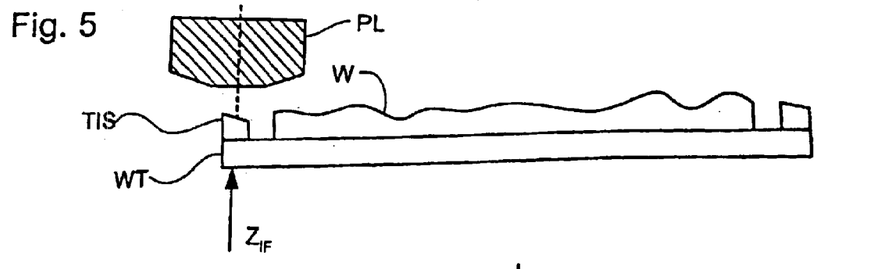
Figure 6:
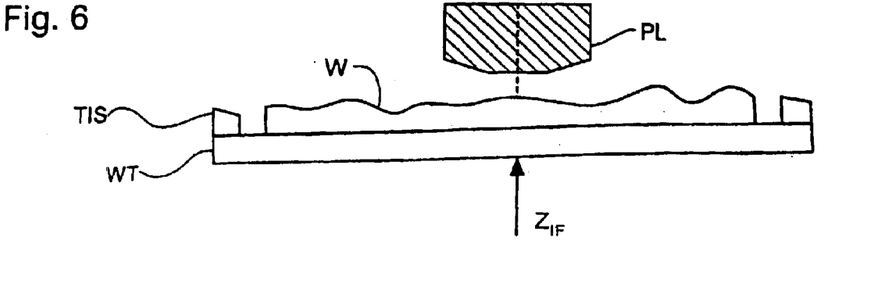

Next, the wafer table is moved to the exposure station and, as shown in FIG. 5, the (physical) reference surface is positioned under the projection lens so as to allow a measurement of its vertical position relative to a reference point in the focal plane of the projection lens. In a preferred embodiment, this is achieved using one or more transmission image sensors (described below) whose detector is physically connected to the reference surface used in the earlier measurements. The transmission image sensor(s) can determine the vertical focus position of the projected image from the mask under the projection lens. Armed with this measurement, the reference plane can be related to the focal plane of the projection lens and an exposure scheme which keeps the wafer surface in optimum focus can be determined. In the prior art this is done by calculating a path for the substrate table in three-dimensions, e.g. defined by Z, Rx and Ry setpoints for a series of points along the scan path. This is shown in FIG. 6. According to the present invention, the shape of the focal plane is also adjusted to improve the focus using available manipulators in the projection lens. This is shown in FIG. 8.

Figure 8:
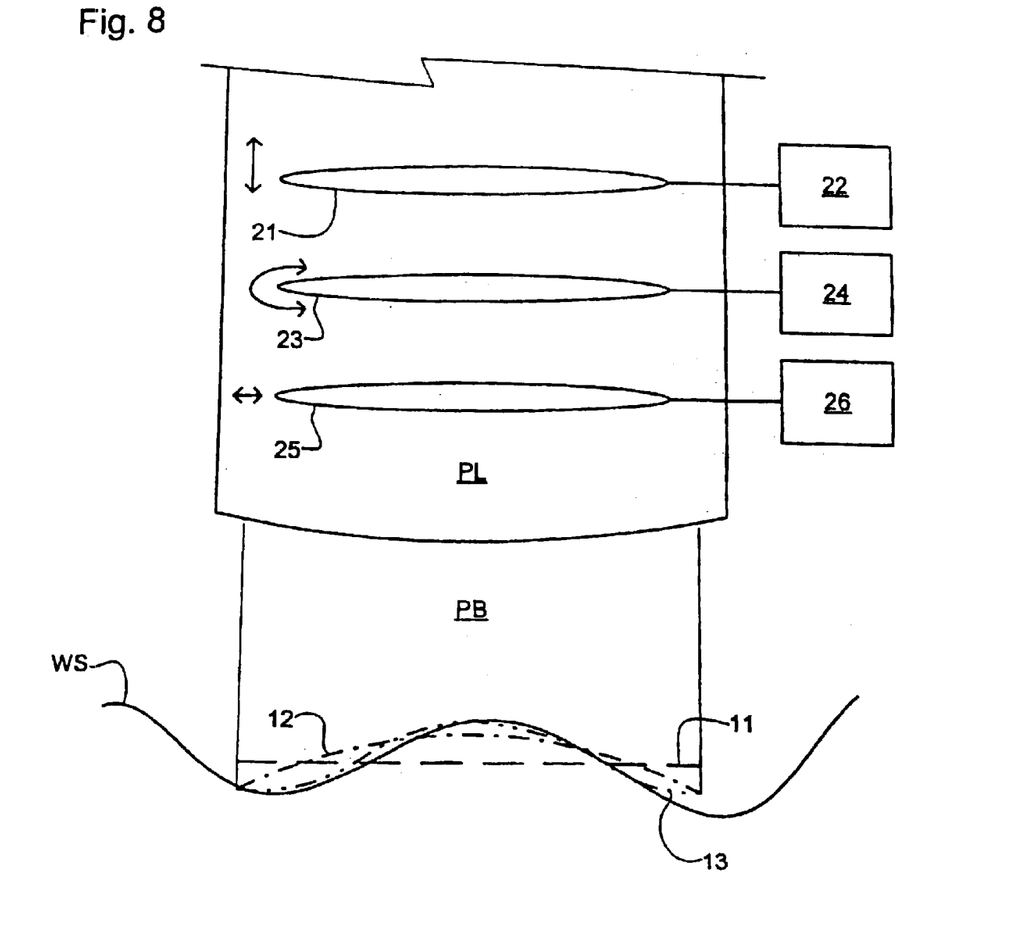
FIG. 8 is a view showing adjustable elements in the projection lens used in the present invention.

As can be seen in FIG. 8, if the wafer surface WS includes significant unflatness, it is impossible to bring it into correct focus in a flat focal plane 11 across the entire area of the exposure slit of the projection beam PB. Instead, it is necessary to position the wafer at a position that minutes the total or average defocus between the wafer surface WS and the flat focal plane 11. According to the invention, the residual defocus can be minimized or eliminated by distorting the focal plane using available manipulators 22, 24, 26 in the projection system PL. Such manipulators 22, 24, 26 may adjust the vertical, horizontal and/or rotational positions of elements 21, 23, 25 in the projection systems. The manipulators used in the present invention may be provided for on-site adjustment of the projection lens, for compensating for transient effects, e.g. lens heating caused by the projection beam, or specifically for the present invention. Lens elements used to correct field curvature caused by adjustments in the magnification of the system are particularly useful in the present invention. According to the invention, the field curvature corrections can be changed, or field curvature deliberately introduced to improve focus on a non-flat substrate. Of course, any other available manipulators which change the (relative) position and/or orientation of one or more lens elements may be used. The invention may also make use of manipulators which change the shape and/or optical properties of elements in the projection system.

The degree of improvement afforded by the present invention will depend on the wafer surface and the number and effect of the available manipulators. As can be seen in FIG. 8, introducing a second order correction results in a focal plane 12 which is closer to the illustrated wafer surface and hence has a reduced defocus. Introducing a fourth order correction results in a focal plane 13 even closer to the wafer surface WS and hence further reduced defocus. If the projection system includes asymmetric elements and suitable manipulators, higher odd order corrections can also be made.

According to the invention, setpoints for p1, p2, etc., where pi, p2, etc. are adjustable parameters of the projection system PL, are determined in addition to setpoints for Z, Rx and Ry. The setpoints can be determined using a least squares method so as to minimize the difference between the wafer map data and the focus plane of the exposure slit image, during the scanning motion. For ease of calculation, the relative motion of the exposure slit image and wafer can be expressed as the slit moving relative to a static wafer. The least squares criterion can then be expressed as, for each time t, finding the values Z(t), Rx(t), Ry(t), p1(t), p2(t), ... etc. which give a minimum value of:

$$LSQ(t) = \frac{1}{s \cdot W} \int_{-s/2}^{+s/2} \int_{-W/2}^{+W/2} [ \quad (1)$$
$$w(x, y, Z(t), x \cdot Ry(t), y \cdot Rx(t)) - FP(p1(t), p2(t), \text{etc.})]^2 \, dx \, dy$$

where w(x,y etc) defines the vertical position of the wafer surface, FP(p1(t), p2(t), etc.) defines the vertical position of the focal plane as a function of p1(t), p2(t), etc, s is the width of the exposure slit in the scanning direction and W its length perpendicular to the scanning direction. The setpoints and the wafer trajectory can be expressed as functions of either Y (position in the scanning direction) or t (time) since these are related by $Y=y_0+v.t$, where $y_0$ is the starting position and v is the scanning speed.

Figure 7:
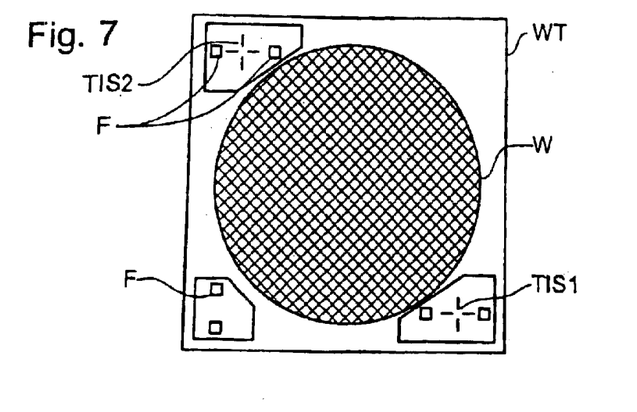
FIG. 7 is a plan view of a substrate table showing the sensors and fiducials used in the focus control and leveling procedure according to the present invention.

As mentioned above, the physical reference surface(s) is (are) preferably a surface in which a transmission image sensor TIDS) is inset. As shown in FIG. 7, two sensors TIS1 and TIS2 are mounted on a fiducial plate mounted to the top surface of the substrate table (WT, WTa or Wmb), at diagonally opposite positions outside the area covered by the wafer W. The fiducial plate is made of a highly stable material with a very low coefficient of thermal expansion, e.g. Invar, and has a flat reflective upper surface which may carry markers used in alignment processes. TIS1 and TIS2 are sensors used to determine directly the vertical (and horizontal) position of the aerial image of the projection lens. They comprise apertures in the respective surface close behind which is placed a photodetector sensitive to the radiation used for the exposure process. To determine the position of the focal plane, the projection lens projects into space an image of a TIS pattern TIS-M provided on the mask MA and having contrasting light and dark regions. The substrate table is then scanned horizontally (in one or preferably two directions) and vertically so that the aperture of the TIS passes through the space where the aerial image is expected to be. As the TIS aperture passes through the light and dark portions of the image of the TIS pattern, the output of the photodetector will fluctuate. This procedure is repeated at different vertical levels. The position at which the rate of change of amplitude of the photodetector output is highest indicates the position at which the image of TIS pattern has the greatest contrast and hence indicates the position of optimum focus. Thereby, a three-dimensional map of the focal plane can be derived. An example of a TS of this type is described in greater detail in U.S. Pat. No. 4,540,277, incorporated herein by reference. Instead of the TIS, a Reflection Image Sensor (RIS) such as that described in U.S. Pat. No. 5,144,363, incorporated herein by reference, may also be used.

Using the surface of the TIS as the physical reference surface has the advantage that the TIS measurement directly relates the reference plane used for the height map to the focal plane of the projection lens, and so the height map can be employed directly to give height corrections for the substrate table during the exposure process. This is illustrated in FIG. 6, which shows the substrate table WT as positioned under the control of the Z-interferometer at a height determined by the height map so that the wafer surface is at the correct position under the projection lens PL.

The TIS surface may additionally carry reference markers whose position is detected using a through-the-lens TTL alignment system to align the substrate table to the mask. Such an alignment system is described in U.S. Pat. No. 5,481,362, incorporated herein by reference, for example. Alignment of individual exposure areas can also be carried out, or may be obviated by an alignment procedure carried out at the measurement stage to align the exposure areas to the reference markers on the substrate table. Such a procedure is described in U.S. Pat. No. 6,297,876, incorporated herein by reference, for example.

With knowledge of the location and extent of the intended exposure areas, the height map generated by the present invention can be used to calculate in advance optimum Z, Rx, Ry, p1, p2, etc. position setpoints for the substrate table or projection system for each exposure. This avoids the time required for leveling in known apparatus that only measure wafer height when the wafer is positioned under the projection lens, and hence increases throughput. The optimum Z, Rx, Ry, p1, p2, etc. setpoints maybe calculated by various known mathematical techniques, for example using an iterative process to minimize defocus (defined as the distance between the wafer surface and the ideal focal plane), LSQ(t), integrated over the exposure area.

A further advantage is possible in the step-and-scan mode. In this mode, the projection lens projects an image of only part of the mask pattern onto a corresponding part of the exposure area. The mask and substrate are then scanned in synchronism through the object and image focal planes of the projection system PL so that the entire mask pattern is imaged onto the whole exposure area. Although in practice the projection lens is held stationary and the mask and substrate are moved, it is often convenient to consider this process in terms of an image slit moving over the wafer surface. With the height map determined in advance by the present invention, it is possible to calculate a sequence of Z, Rx, Ry, p1, p2, etc. setpoints matched to the XY scan path (usually, scanning takes place in only one direction, e.g. Y). The sequence of setpoints can be optimized according to additional criteria, e.g. to minimize vertical accelerations or tilt motions that might reduce throughput or induce undesirable vibrations. Given a sequence of spaced-apart setpoints, a scanning trajectory for the exposure can be calculated using a polynomial or spline fitting procedure.

While the present invention aims to position the wafer at the optimum position in Z, Rx and Ry and adjust the shape of the focal plane for a given exposure, the variations in wafer surface height over the exposure area may be such that the wafer cannot be positioned and the focal plane shaped to give adequate focus over the entire area. Such so-called focus spots can result in an exposure failure. However, with the present invention such failures can be predicted in advance and remedial action can be taken. For example, the wafer may be stripped and re-coated without the detrimental effect of further processing a badly exposed wafer. Alternatively, if the predicted failure affects only one or a few devices on the wafer while others will be acceptable, throughput maybe enhanced by skipping exposures that can be predicted in advance to result in defective devices.

Figure 9:
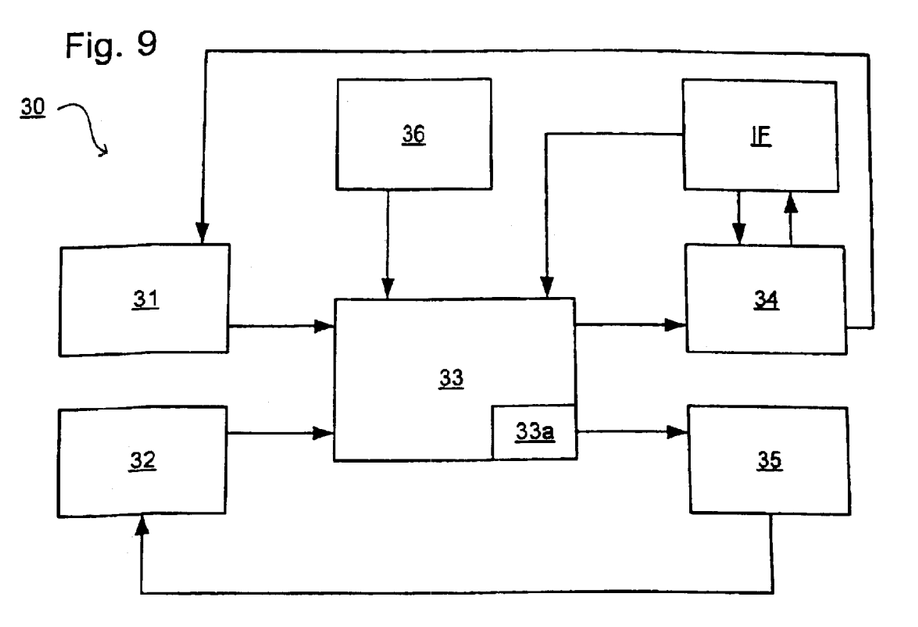
FIG. 9 is a diagram of a control system for putting the present invention into effect.

A control system 30 used in implementing the present invention is shown in FIG. 9. In FIG. 9, data describing the wafer surface is supplied by wafer height map 31, which may comprise a memory in which a previously derived wafer height map has been stored, or a level sensor directly measuring the wafer surface, in real time, and data describing the focal plane from focal plane map 32. Since it is generally impractical to continuously measure the configuration of the focal plane, the focal plane map 32 is generally a memory storing the results of periodic measurements of the focal plane shape, supplemented as necessary by a model of how the focal plane changes with varying imaging parameters. Where continuous or quasi-continuous measurement of the focal plane is possible, that may also be used. The data describing the wafer surface and the focal plane shape is used by controller 33 to calculate setpoints for the substrate table position (Z, Rx and Ry) and projection lens parameters (p1, p2, etc.) which are supplied to servo controller 34 for table positioning and servo controller 35 for control of the manipulators 22, 24, 26 of the projection system PL. The table positioning servo controller 34 may employ a feedback control using the table position as measured by the interferometric displacement measuring system IF. The table position can also be used to control read-out from a memory 33a of setpoints calculated in advance. The adjustments to projection system parameters p1, p2, etc. can be fed back from the servo controller 35 to the focal plane map 32. The projection system may, as mentioned above, also be subject to adjustment to compensate for other, particularly transient, effects such as lens heating. Corrections to the projection system to effect the necessary compensations for such effects can be supplied by relevant control systems 36 and combined with adjustments for leveling and focusing according to the invention.

The control system 30 also includes a feedback from wafer height map 31 to servo controller 34 to allow control of the substrate table position in real time (on-the-fly). This feedback can be omitted if only off-axis leveling—in which the substrate table positions during the scan are stored in advance in memory—is to be performed.

How the necessary adjustments to arrive at optimum focus are divided among the different adjustable parameters will be determined as the invention is implemented in a specific apparatus. In many apparatus, the range of adjustment of the substrate table and its speed of response will be greater than those of the adjustable elements in the projection system In such a case it can be convenient to separate the $0^{th}$ and $1^{st}$ order corrections from the higher order corrections and position the substrate table to correct for these; the $0^{th}$ and $1^{st}$ order correction are effectively height and tilt corrections whereas the higher order corrections represent variations in the wafer surface within the exposure slit which cannot therefore be compensated for by changing the height or tilt of the wafer surface. Although it is preferred to utilize the substrate table to perform the $0^{th}$ or $1^{st}$ order correction, it is also contemplated that these corrections are performed by adjusting adjustable elements in the projection system. Where separation of $0^{th}$ and $1^{st}$ order from higher order correction is utilized, the separation may be done in the input data. For example, it would be possible to subtract the wafer surface and focal plane to derive a correction surface and for each exposure or point in the exposure path, then fit a flat, but inclined plane to the correction surface. The height of that flat plane at the center of the exposure slit determines the necessary height correction ($0^{th}$ order) and its inclination gives the necessary tilt corrections ($1^{st}$ order). The flat inclined plane is then subtracted from the correction surface leaving the higher orders for correction by adjustment of the projection lens parameters.

In some apparatus, adjustment of the projection lens parameters to achieve desired higher order corrections may cause unavoidable changes in the vertical position and inclination ($0^{th}$ and $1^{st}$ order) of the focal plane. Where such crosstalk between the higher and lower order corrections occurs, an integrated control algorithm, rather than separation of the higher and lower orders, may be preferable. Alternatively, higher order corrections may be calculated first and any consequential effects in the lower order fed across into calculation of the necessary lower order corrections.

In scanning apparatus having an exposure slit that is relatively narrow in the scanning direction as compared to its width in the transverse direction (perpendicular to the scanning direction) and having mainly rotationally symmetric elements in the projection lens, the higher order corrections in particular maybe performed mainly to compensate for the wafer surface shape in the transverse direction. This is because, with symmetric elements in the projection system, separate changes to the shape of the focal plane in the scanning and transverse directions are impossible. Thus, a change in the curvature of the focal plane in the transverse direction would result in a change in the scanning direction but because of the greater dimension of the exposure slit in the transverse direction, the curvatures that are necessary to compensate for deviations in the transverse direction would only result in small vertical deviations at the extremes in the scanning direction. Further, focus deviations in the scanning direction are averaged out by the scanning motion, and in many cases can therefore be disregarded.

Where the wafer shape is primarily determined by previous process layers and a number of similar or identical dies are to be printed on one or more wafers, it may be possible to predict or calculate corrections only once for each die type in a wafer or batch of wafers. In some cases, the higher order wafer shape may be determined by previous process layers but superimposed on height and tilt variations across and between wafers and/or exposure areas. In such a case, the higher order corrections for each die type may be calculated in advance and combined with lower order corrections calculated for each exposure area.

While we have described above specific embodiments of the invention it will be appreciated that the invention may be practiced otherwise than as described. The description is not intended to limit the invention.

What is claimed is:

1. A lithographic projection apparatus comprising:
    a radiation system to supply a projection beam of radiation;
    a support structure to support a patterning structure which can be used to pattern the projection beam according to a desired pattern;
    a substrate table to hold a substrate;
    a projection system to project the patterned projection beam onto a target portion of the substrate, said projection system having a focal plane and comprising at least one adjustable refractive optical element capable of changing the shape of the focal plane; and
    a controller, operative during an exposure to image the irradiated portion, to control said adjustable refractive optical element to change the shape of said focal plane to improve conformity to the surface contour of said exposure area.

2. Apparatus according to claim 1 wherein said controller comprises a memory to store data representative of said surface contour.

3. Apparatus according to claim 2 wherein said apparatus further comprises a measurement station having a substrate height measurement device operative in advance of an exposure to measure the substrate surface contour of at least one exposure area, for storage in said memory.

4. Apparatus according to claim 2 wherein said controller further comprises an interface to receive data representative of said surface contour from an external device.

5. Apparatus according to claim 2 wherein said controller is operative to calculate desired adjustments to said adjustable refractive optical element for a given exposure in advance of that exposure.

6. Apparatus according to claim 1 wherein said apparatus further comprises a sensor to measure the position of the substrate surface at a plurality of points in said exposure area during an exposure.

7. Apparatus according to claim 1 further comprising an actuator to move said substrate table to position the substrate at at least one of a desired position and a desired orientation and wherein said controller is also operative to control said actuator to position the substrate.

8. Apparatus according to claim 7 wherein said controller is adapted to control said actuator to effect low order corrections to bring the surface of said substrate at said exposure area into closer conformity with said focal plane and to control said adjustable element to effect high order corrections.

9. Apparatus according to claim 8 wherein said low order corrections comprise position and orientation corrections.

10. Apparatus according to claim 8 wherein said controller is adapted to control said actuator to effect low order corrections to compensate for low order effects caused by adjustments of said adjustable refractive optical element.

11. Apparatus according to claim 1 wherein a magnification ratio of the projection system is not equal to unity.

12. Apparatus according to claim 1 wherein the support structure and the substrate holder are movable relative to each other in a plane perpendicular to an optical axis of the apparatus.

13. A lithographic projection apparatus comprising:

a radiation system to supply a projection beam of radiation;

a support structure to support a patterning structure which can be used to pattern the projection beam according to a desired pattern;

a substrate table to hold a substrate;

a projection system to project the patterned beam onto a target portion of the substrate, said projection system having a focal plane and comprising at least one adjustable refractive optical element capable of changing the shape of the focal plane; and a controller, operative during an exposure to image the irradiated portion, to control said adjustable refractive optical element to change the shape of said focal plane to improve conformity to the surface contour of said exposure area, wherein said adjustable refractive optical element is a field-curvature correction lens.

14. A device manufacturing method comprising:

projecting a patterned beam of radiation onto a target portion of a layer of radiation sensitive material on a substrate; and controlling an adjustable refractive optical element of a projection system used for the projecting, during said projecting, to change the shape of said focal plane to improve conformity to a surface contour of said target portion.

15. A method according to claim 14 further comprising measuring the surface contour of said target portion in advance of the projecting.

16. A method according to claim 15 wherein said measuring is performed using at least one of a measurement station in a lithographic apparatus and a separate qualification tool.

17. A method according to claim 15 further comprising calculating adjustments to the adjustable refractive optical element in advance of projecting onto a particular target portion.

18. A method according to claim 17 wherein a plurality of similar target portions are imaged and adjustments calculated in said calculating are used in imaging a plurality of target portions.

19. A device manufactured according to the method of claim 14.

20. A method according to claim 14 wherein a magnification ratio of the projection system is not equal to unity.

* * * * *